(12) United States Patent
Kwong

(10) Patent No.: US 7,996,806 B2
(45) Date of Patent: Aug. 9, 2011

(54) METHODS AND APPARATUS FOR LAYOUT OF MULTI-LAYER CIRCUIT SUBSTRATES

(75) Inventor: David Kwong, Fremont, CA (US)

(73) Assignee: Electronics for Imaging, Inc., Foster City, CA (US)

( * ) Notice: Subject to any disclaimer, the term of this patent is extended or adjusted under 35 U.S.C. 154(b) by 670 days.

(21) Appl. No.: 12/027,146

(22) Filed: Feb. 6, 2008

(65) Prior Publication Data
US 2009/0199149 A1    Aug. 6, 2009

(51) Int. Cl.
    *G06F 17/50*    (2006.01)
(52) U.S. Cl. ........ 716/126; 716/122; 716/129; 716/130; 716/137; 716/139
(58) Field of Classification Search .............. 716/12–15, 716/126, 129, 130, 137, 122, 139
See application file for complete search history.

(56) References Cited

U.S. PATENT DOCUMENTS

| | | | |
|---|---|---|---|
| 5,463,191 A | 10/1995 | Bell et al. | |
| 5,847,936 A | 12/1998 | Forehand et al. | |
| 6,162,997 A | 12/2000 | Memis | |
| 6,372,543 B1 | 4/2002 | Chiu et al. | |
| 6,534,872 B1 | 3/2003 | Freda et al. | |
| 6,880,143 B1 | 4/2005 | Yu | |
| 7,069,650 B2 | 7/2006 | Wyrzykowska et al. | |
| 7,353,480 B1 * | 4/2008 | Minacapelli | 716/122 |
| 2003/0047348 A1 * | 3/2003 | Jessep et al. | 174/250 |
| 2005/0006782 A1 * | 1/2005 | Yao et al. | 257/774 |
| 2005/0282314 A1 * | 12/2005 | Lo et al. | 438/117 |
| 2006/0112366 A1 | 5/2006 | Wadland et al. | |
| 2006/0125573 A1 * | 6/2006 | Brunette et al. | 333/33 |
| 2006/0231833 A1 * | 10/2006 | Winings et al. | 257/48 |
| 2008/0291602 A1 * | 11/2008 | Devoe | 361/306.3 |

* cited by examiner

*Primary Examiner* — Vuthe Siek
(74) *Attorney, Agent, or Firm* — Michael A. Glenn; Glenn Patent Group

(57) ABSTRACT

Methods and apparatus are provided for designing and laying out multi-layer circuit substrates, such as multi-layer PCBs. Dynamic vias are provided on intermediate PCB layers. Each dynamic via has features that adjust based on the trace layout of the corresponding intermediate layer. In particular, each dynamic via has a second radius R2 if the via is not connected to any trace on the corresponding intermediate layer. If a trace is connected to a dynamic via, the via radius changes from the second radius R2 to a first radius R1, where R1 is greater than R2.

20 Claims, 21 Drawing Sheets

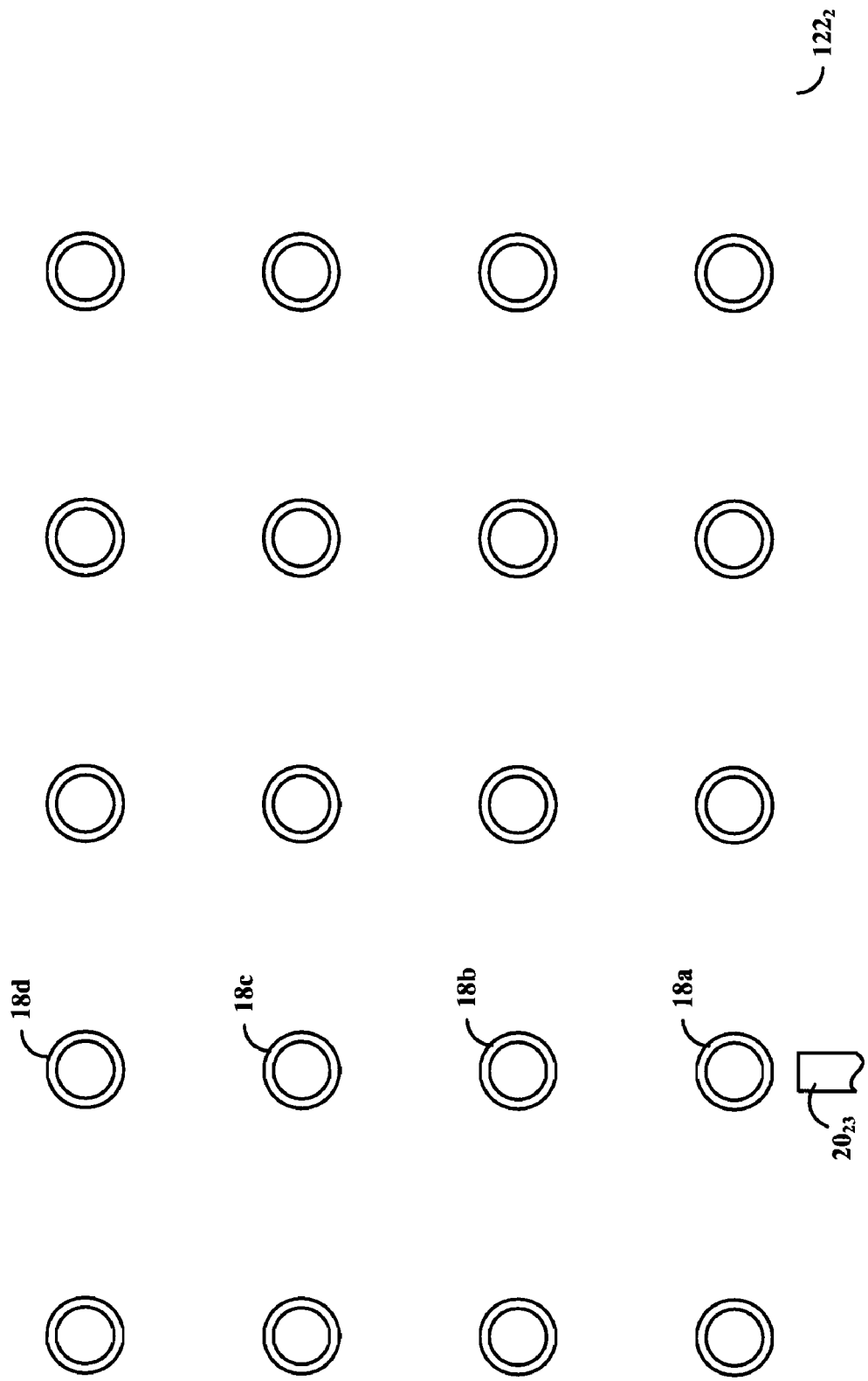

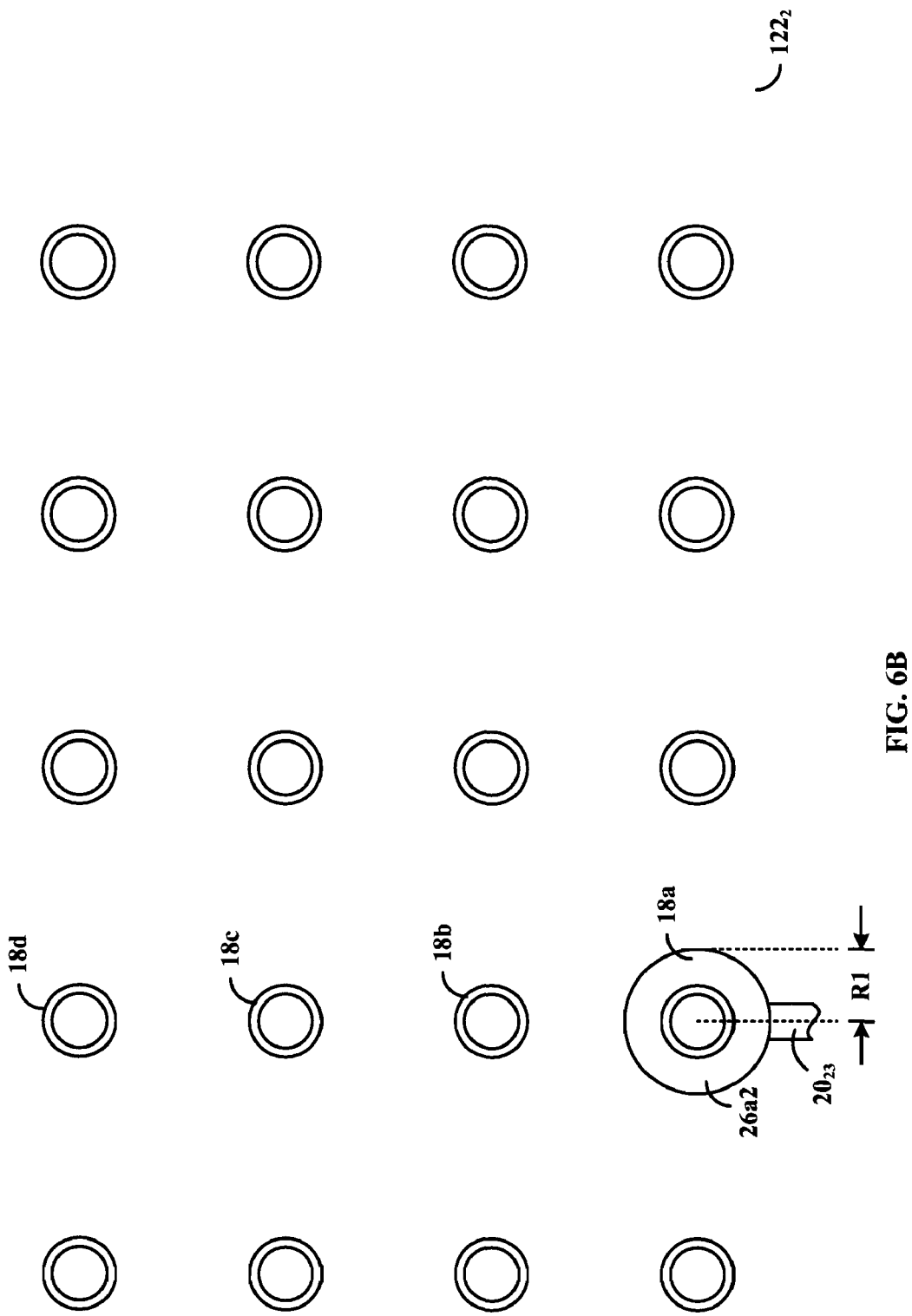

METHODS AND APPARATUS FOR LAYOUT OF MULTI-LAYER CIRCUIT SUBSTRATES

BACKGROUND

This invention pertains to apparatus and methods for designing and laying out multi-layer circuit substrates, such as multi-layer printed circuit boards ("PCBs").

PCBs are widely used as circuit substrates for mechanically mounting electrical components and for electrically interconnecting the mounted electrical components. PCBs typically include one or more layers of an insulating substrate (such as fiberglass). During PCB manufacture, a metal layer is deposited on a surface of a substrate layer, and the metal layer is then chemically etched to form a pattern of conductors (or "traces") on the substrate surface. Multiple substrate/metal layers may be sandwiched together to form a multi-layer PCB.

To interconnect traces between the layers, and to provide a means for attaching electrical components to the PCB, "vias" are formed by drilling holes through the various metal and substrate layers. The holes are typically cylindrically shaped channels formed perpendicular to the PCB substrate surface. The holes are subsequently filled with an electrically conducting material (e.g., solder) to form a low resistance electrical connection between the various layers along the length of the via. A via typically includes a cylindrically-shaped pad on each of the PCB's top and bottom layers and one or more intermediate layers.

PCBs typically are designed using specialized computer aided design ("CAD") software programs, such as Allegro PCB Design, by Cadence Design Systems, San Jose, Calif. PCB CAD software programs typically include layout tools for specifying the placement and routing of the various traces, electrical components and vias on a PCB. The layout tools typically perform design rule verification functions to assure that the layout complies with design rules specifying various parameters such as minimum trace-to-trace separations and other parameters. Once a PCB board layout is complete, the PCB CAD software program may be used to generate a "Gerber file" that defines the PCB layout definition. A PCB manufacturer may then use the Gerber file to fabricate PCBs in accordance with the design specified in the Gerber file.

PCB CAD software programs typically include a "via definition" that defines the physical dimensions of the vias that are used in the PCB design. The programs typically utilize a single static via definition for each PCB design—that is, all vias have the exact same geometrical dimensions. Further, the via definition typically includes a pad on each layer of the PCB, including each intermediate layer. Thus, PCB CAD software programs typically generate PCB designs that specify vias having pads on the top and bottom layers and on all intermediate layers.

PCB board manufacturers, however, prefer to remove intermediate pads that are not connected to any traces. In particular, removing such unused intermediate pads minimizes cost and increases reliability by decreasing stray capacitance and reducing manufacturing defects such as short circuits. Some manufacturers use software that scans Gerber files to identify such unused intermediate pads, and then modifies the files to eliminate the unused intermediate pads. Also, some PCB CAD software programs include an option that removes unused intermediate pads during the process used to generate the Gerber file.

Such "pad stripping" techniques, however, occur only after PCB design is complete. Thus, during the design process, the PCB layout is implemented assuming that all vias include pads on all layers, including all intermediate layers. In this regard, the design rule verification functions enforce design rules (such as the minimum separation between a trace and an adjacent via) based on a pre-pad-stripping geometry. Thus, even if a designer knows that a particular via pad on a particular intermediate layer will be subsequently stripped away during the manufacturing process (and thus a larger area could be used for laying out traces), the PCB CAD software programs prohibit the designer from utilizing such unused real estate. As a result, previously known PCB CAD software programs do not permit efficient PCB layout.

SUMMARY

Methods and apparatus in accordance with this invention may be used to design and lay out multi-layer circuit substrates, such as multi-layer PCBs. In particular, methods and apparatus in accordance with this invention design PCB layouts using "dynamic vias" on intermediate PCB layers. Each dynamic via has features that adjust based on the trace layout of the corresponding intermediate layer. In particular, each dynamic via has a second radius $R2$ if the via is not connected to any trace on the corresponding intermediate layer. If a trace is connected to a dynamic via, the via radius changes from the second radius $R2$ to a first radius $R1$, where $R1$ is greater than $R2$.

Exemplary methods in accordance with this invention may be implemented in PCB CAD software programs that include layout tools that allow a user to specify the placement and routing of the various traces on each layer of a multi-layer PCB. For top and bottom layers, exemplary PCB CAD software programs in accordance with this invention operate in the same manner as conventional PCB CAD software programs. For intermediate layers, however, PCB CAD software programs in accordance with this invention include dynamic vias that have features that adjust based on the trace layout.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 6A-6G are plan views of the exemplary intermediate layer of FIG. 5 designed in accordance with this invention;

DETAILED DESCRIPTION

Figure 1:
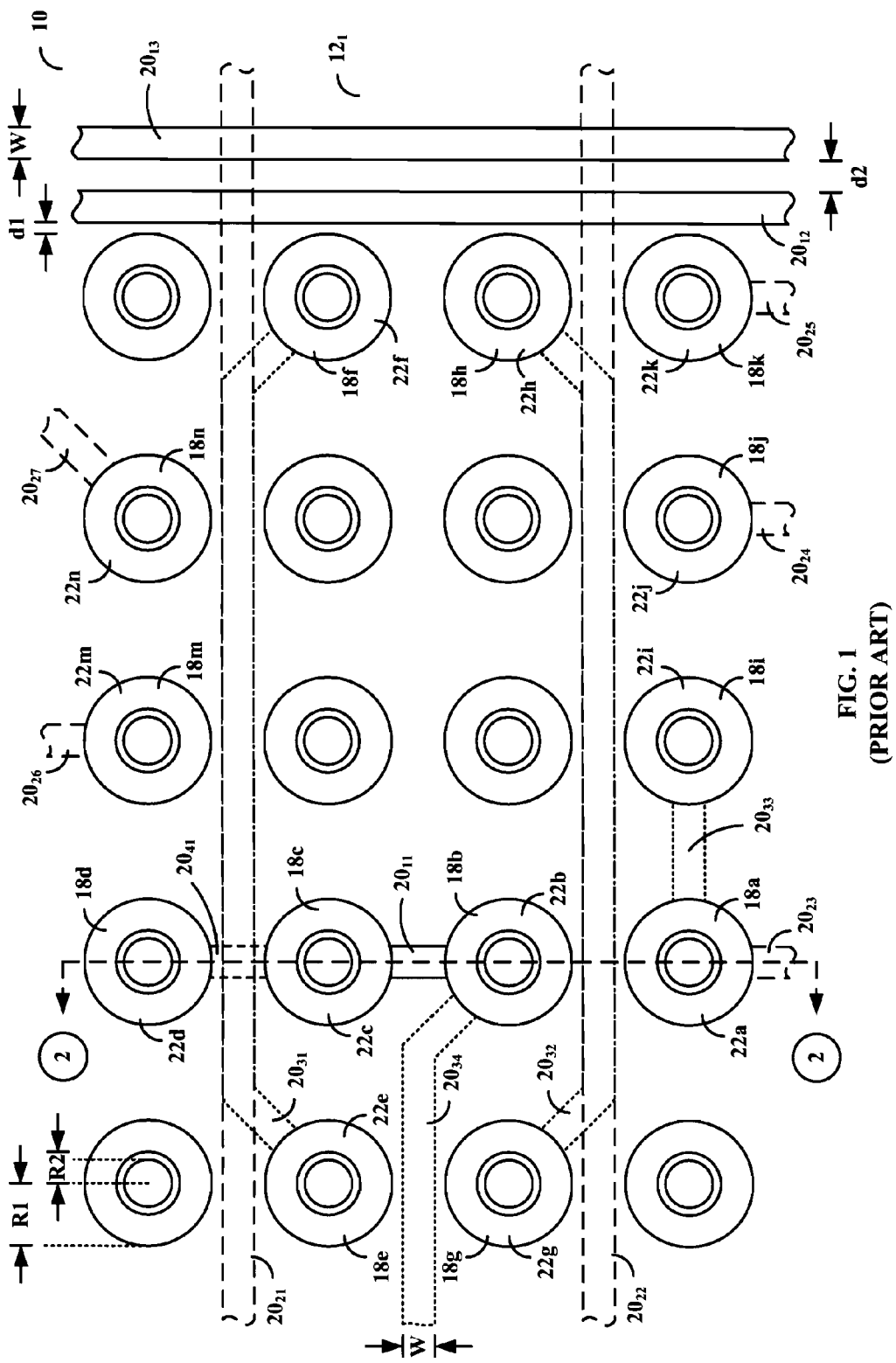
FIG. 1 is a plan view of a multi-layer PCB designed using conventional PCB layout techniques.
Figure 2:
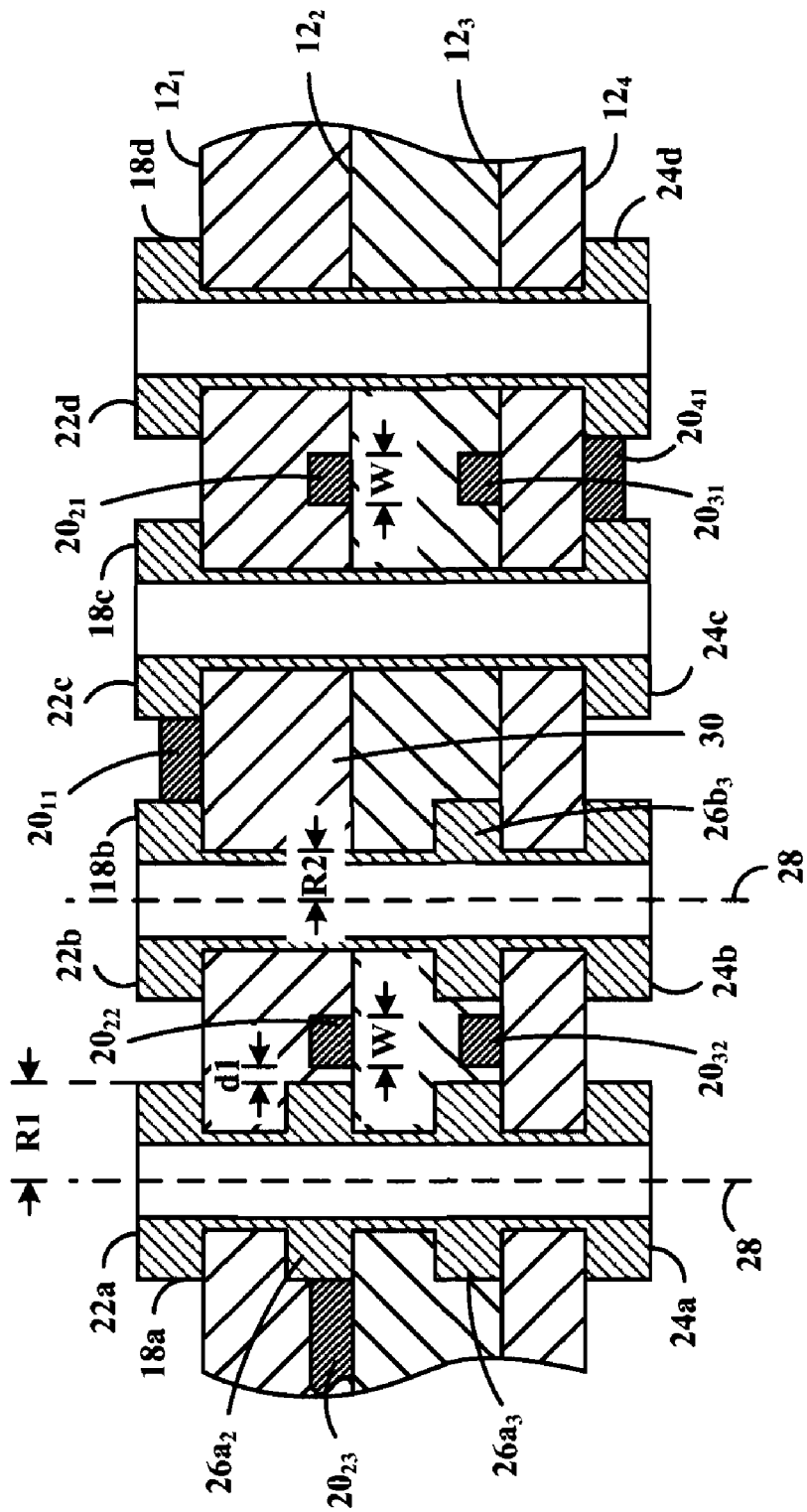
FIG. 2 is a cross-sectional side view of the multi-layer PCB of FIG. 1.

FIGS. 1 and 2 illustrate an exemplary multi-layer PCB 10 designed using conventional PCB layout techniques (e.g., using a conventional PCB CAD software program). PCB 10 includes four layers 12 for routing traces 20. In particular, PCB 10 includes a first layer $12_1$ that includes traces $20_1$, a second layer $12_2$ that includes traces $20_2$, a third layer $12_3$ that includes traces $20_3$, and a fourth layer $12_4$ that includes traces $20_4$. First layer $12_1$ is also referred to herein as a top layer, fourth layer $12_4$ is also referred to herein as a bottom layer, and second and third layers $12_2$ and $12_3$, respectively, are also referred to herein as intermediate layers.

PCB 10 also includes a plurality a vias 18. Each via 18 includes a top pad 22 and a bottom pad 24, and also may include one or more intermediate pads 26 on intermediate layers $12_2$ and $12_3$. In particular, via 18a includes intermediate pads $26a_2$ and $26a_3$, and via 18b includes intermediate pad $26b_3$. Vias 18c and 18d include no intermediate pads 26. Each via 18 includes a center axis 28. On top and bottom layers $12_1$ and $12_2$, respectively, vias 18 have a first radius R1, which equals the radius of top and bottom pads 22 and 24, respectively. As described in more detail below, on intermediate layers, vias 18 may have either the first radius R1 or a second radius R2, wherein R2 is less than R1. Design rules specify a minimum trace-to-pad air gap d1, a minimum trace-to-trace air gap d2 (not shown), and a minimum trace width W.

Figure 3A:
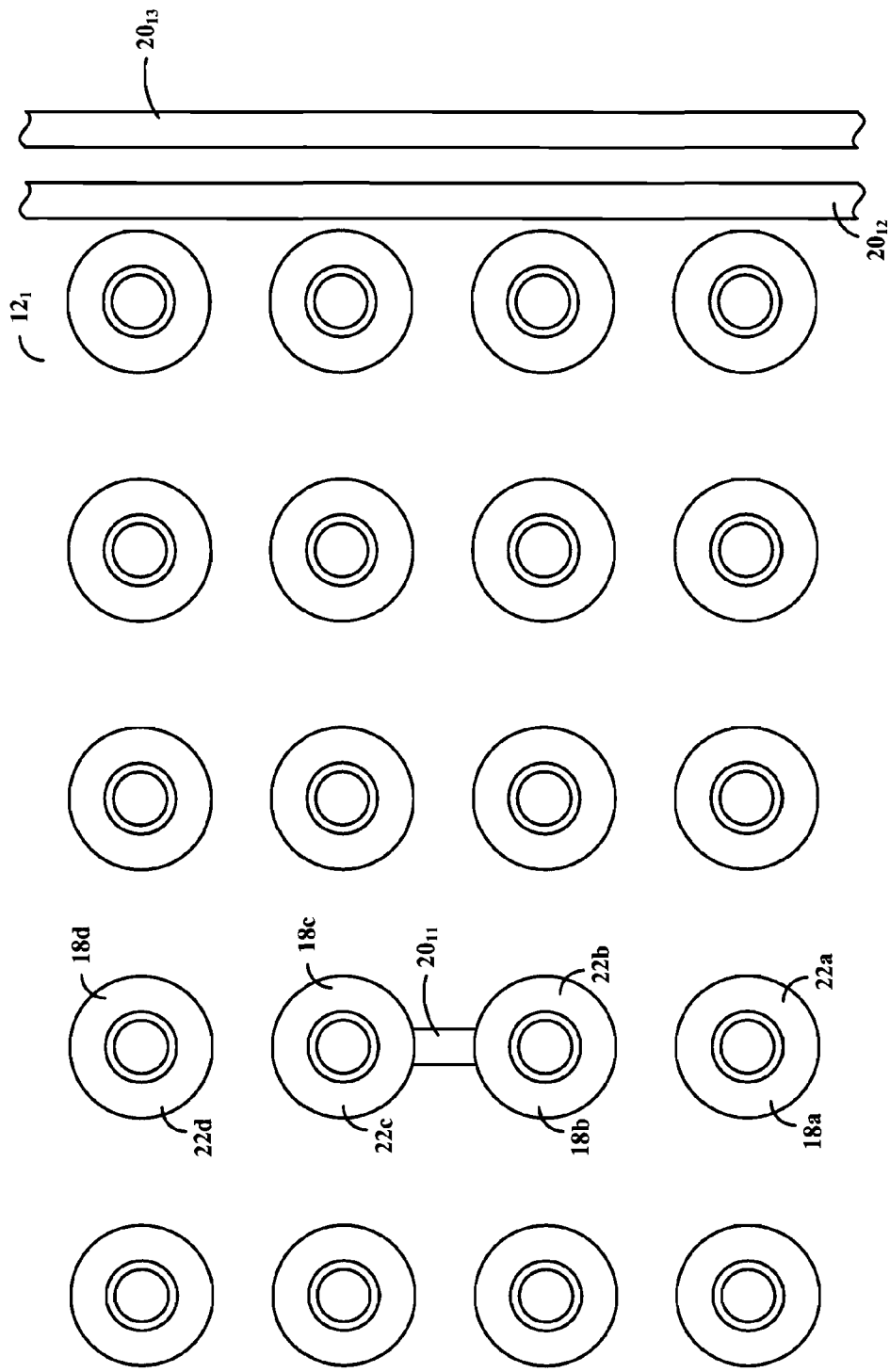
FIG. 3A is a plan view of a top layer of the multi-layer PCB of FIG. 1.
Figure 3B:
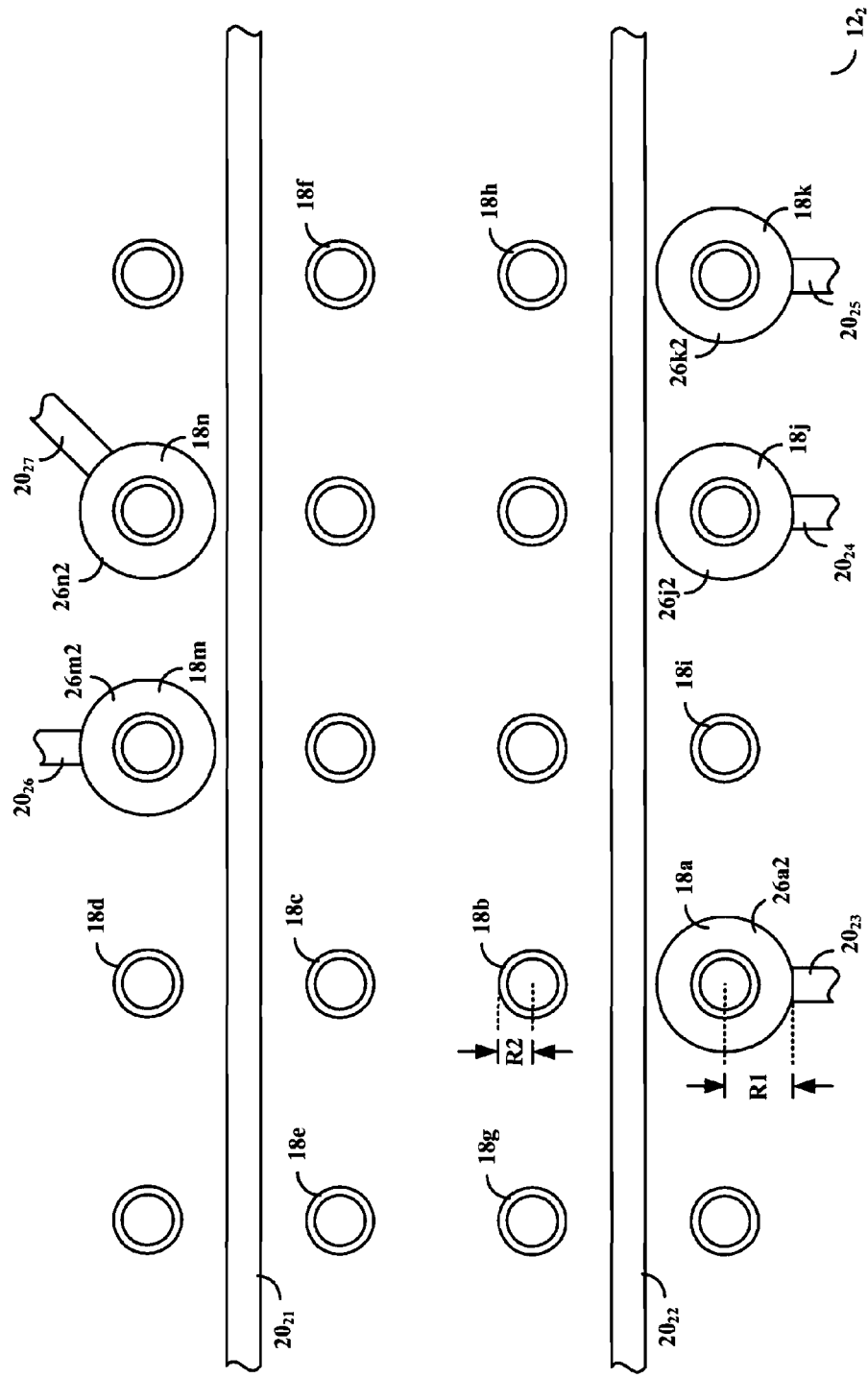
FIG. 3B is a plan view of an intermediate layer of the multi-layer PCB of FIG. 1.
Figure 3C:
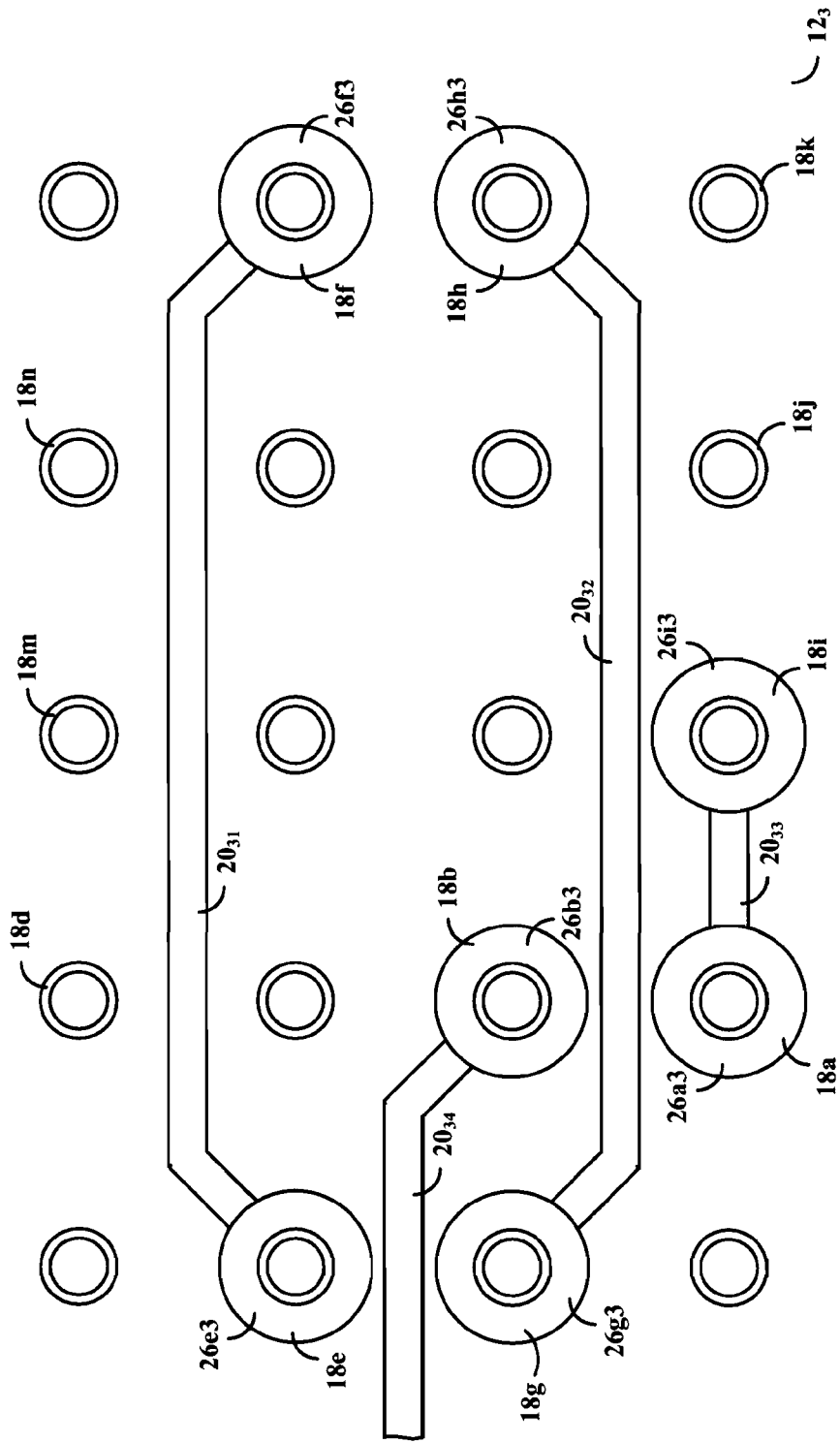
FIG. 3C is a plan view of another intermediate layer of the multi-layer PCB of FIG. 1.
Figure 3D:
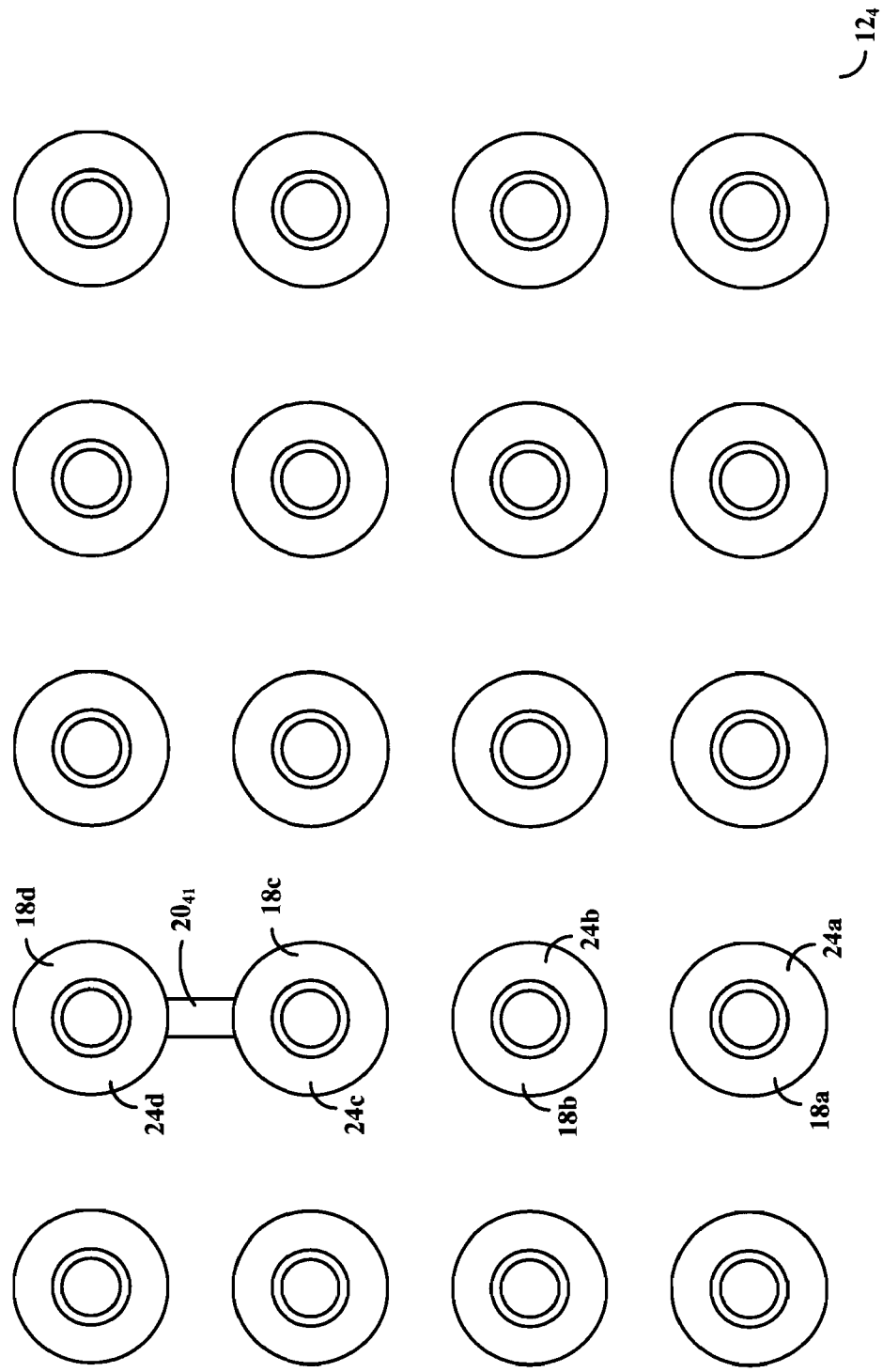
FIG. 3D is a plan view of a bottom layer of the multi-layer PCB of FIG. 1.

Traces 20 are coupled to vias 18 at via pads (e.g., top pads 22, bottom pads 24 and intermediate pads 26). In particular, as illustrated in FIGS. 1 and 3A, on first layer $12_1$, trace $20_{11}$ is coupled to top pads 22b and 22c of vias 18b and 18c, respectively. As illustrated in FIGS. 1 and 3B, on second layer $12_2$, traces $20_{23}$, $20_{24}$, $20_{25}$, $20_{26}$ and $20_{27}$ are coupled to intermediate pads 26a2, 26j2, 26k2, 26m2 and 26n2, respectively, of vias 18a, 18j, 18k, 18m and 18n, respectively. As shown in FIGS. 1 and 3C, on third layer $12_3$, trace $20_{31}$ is coupled to intermediate pads 26e3 and 26f3 of vias 18e and 18f, respectively, trace $20_{32}$ is coupled to intermediate pads 26g3 and 26h3 of vias 18g and 18h, respectively, trace $20_{33}$ is coupled to intermediate pads 26a3 and 26i3 of vias 18a and 18i, respectively, and trace $20_{34}$ is coupled to intermediate pad 26b3 of via 18b. As shown in FIGS. 1 and 3D, on fourth layer $12_4$, trace $20_{41}$ is coupled to bottom pads 24c and 24d of vias 18c and 18d, respectively.

During manufacture of PCB 10, any intermediate pads 26 that are not connected to any trace 20 are removed. For example, as illustrated in FIGS. 2 and 3B, vias 18b and 18c are not connected to any traces 20 on second layer $12_2$, and thus vias 18b and 18c do not have any intermediate pads 26 on second layer $12_2$. Similarly, as illustrated in FIG. 3C, vias 18d and 18m are not connected to any traces 20 on third layer $12_3$, and thus vias 18d and 18m do not include any intermediate pads 26 on third layer $12_3$.

As a result, the radius of a via 18 on an intermediate layer may be either R1 or R2 depending on whether the via 18 includes an intermediate pad 26 on the intermediate layer. In particular, a via 18 that includes an intermediate pad 26 on an intermediate layer has a radius R1 on that layer. For example, as shown in FIG. 2, via 18a has a radius R1 on intermediate layers $12_2$ and $12_3$. In contrast, a via 18 that does not include an intermediate pad 26 on an intermediate layer has a radius R2 on that layer. For example, as shown in FIGS. 2 and 3B, via 18b has a radius R2 on intermediate layer $12_2$. R2 is less than R1, and equals the via radius without a pad.

Although unused intermediate pads 26 are typically removed during manufacture, conventional PCB CAD software programs used to design PCB 10 enforce design rules that assume that all vias 18 include intermediate pads 26 on all intermediate layers, and that all vias have a radius R1 on all intermediate layers. For example, referring to FIG. 2, although vias 18b and 18c do not have any intermediate pads 26 on second layer $12_2$, and although more than one minimum width trace 20 can fit in region 30 between vias 18b and 18c on that layer, conventional PCB CAD software programs would prohibit a user from laying out more than a single trace in region 30.

Methods and apparatus in accordance with this invention overcome these disadvantages by providing "dynamic vias" that are used during the PCB design phase, and that have features that adjust based on whether the via is connected to a trace on that intermediate layer. In particular, PCB CAD software programs in accordance with this invention include layout tools that allow a user to specify the placement and routing of the various traces on each layer of a multi-layer PCB. For the top and bottom layers, PCB CAD software programs in accordance with this invention operate in the same manner as conventional PCB CAD software programs. For intermediate layers, however, PCB CAD software programs in accordance with this invention include dynamic vias that have features that adjust based on the trace layout. As a result, more traces may be laid out on a given intermediate layer, which may reduce the number of layers required to implement a PCB design.

Figure 4A:
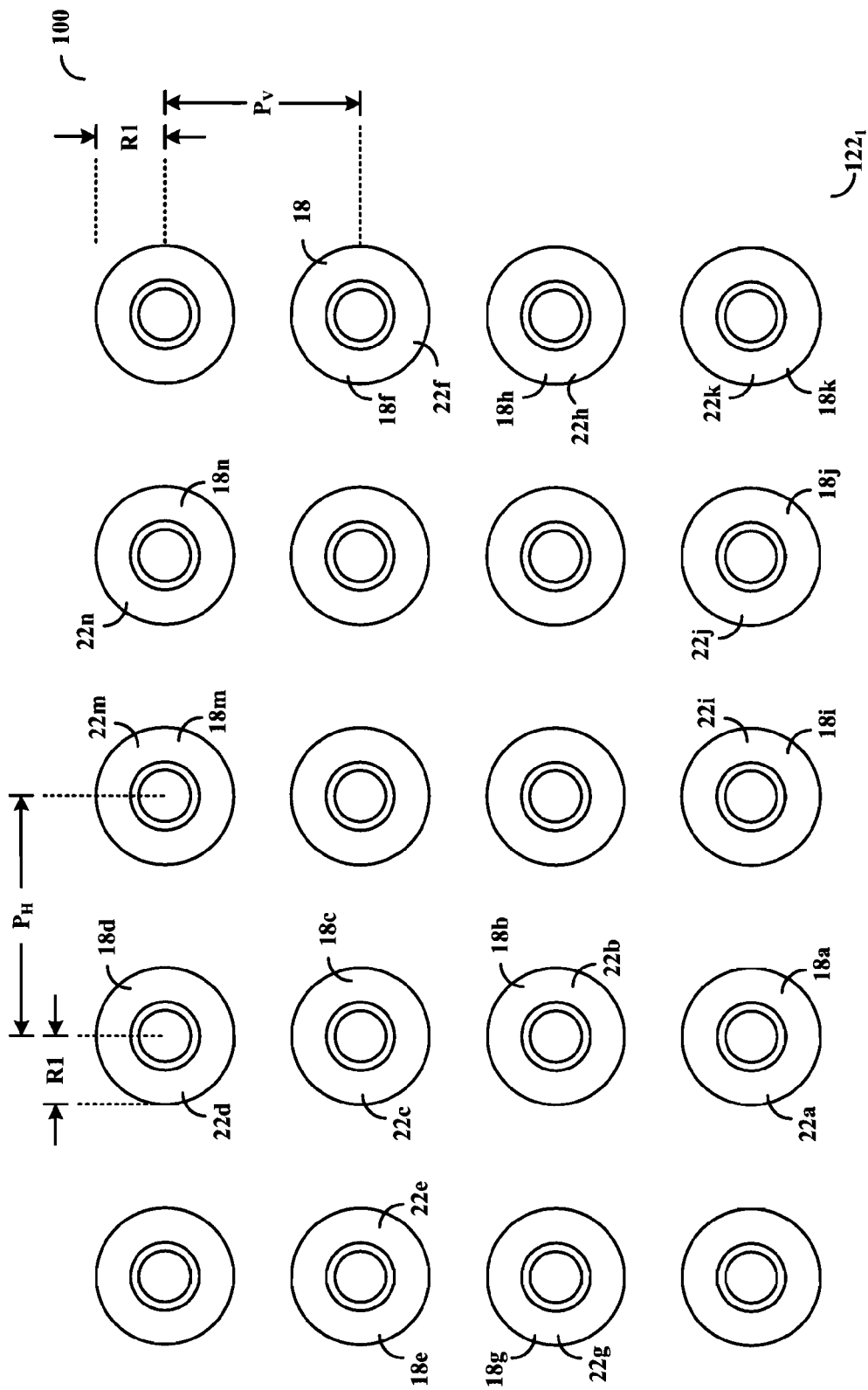
FIG. 4A is a plan view of an exemplary top layer of a multi-layer PCB designed using PCB layout techniques in accordance with this invention.
Figure 4B:
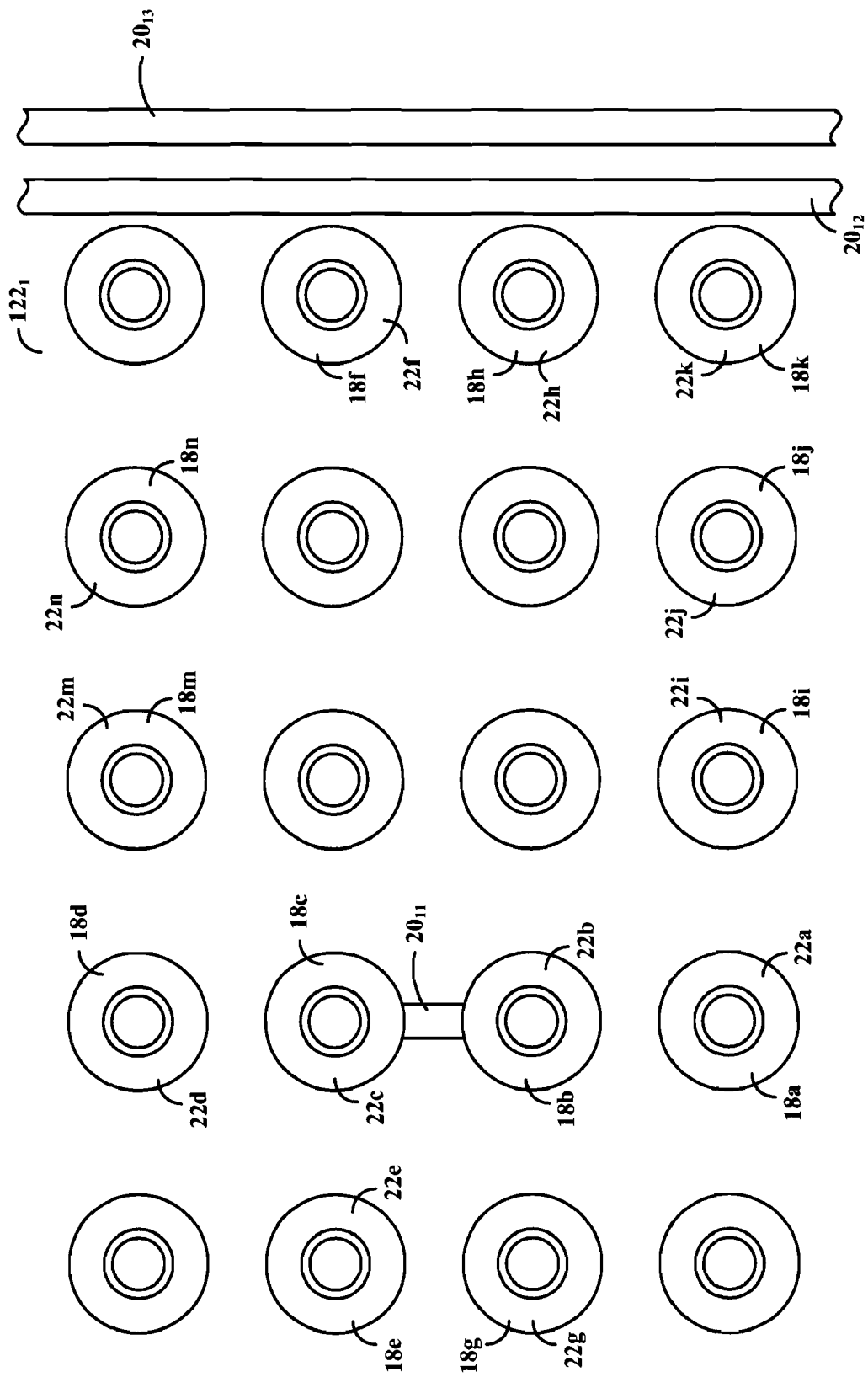
FIG. 4B is another plan view of the exemplary top layer of FIG. 4A.

As an example, methods and apparatus in accordance with this invention may be used to design a three layer PCB that has the same electrical connectivity as the four-layer PCB shown in FIGS. 3A-3C. In particular, when a user initiates a new PCB layout, the user may specify dimensions (such as first radius R1 and second radius R2) for all vias 18 in the layout. After a user specifies the center axis locations of each via 18, methods in accordance with this invention may display an "initial" plan view of a top layer of the PCB layout 100 (i.e., a view of the top layer before any traces 20 have been laid out). FIG. 4A illustrates an exemplary initial plan view of top layer $122_1$. In the illustrated example, vias 18 have a horizontal pitch $P_H$ and a vertical pitch $P_V$. The horizontal pitch $P_H$ and vertical pitch $P_V$ may be equal to one another, or may be different from one another. All vias 18 have a radius R1 on top layer $122_1$. A user may lay out traces 20 on the top layer $122_1$ in the same manner as with a conventional PCB CAD software program. FIG. 4B illustrates an exemplary layout of top layer $122_1$.

Figure 4C:
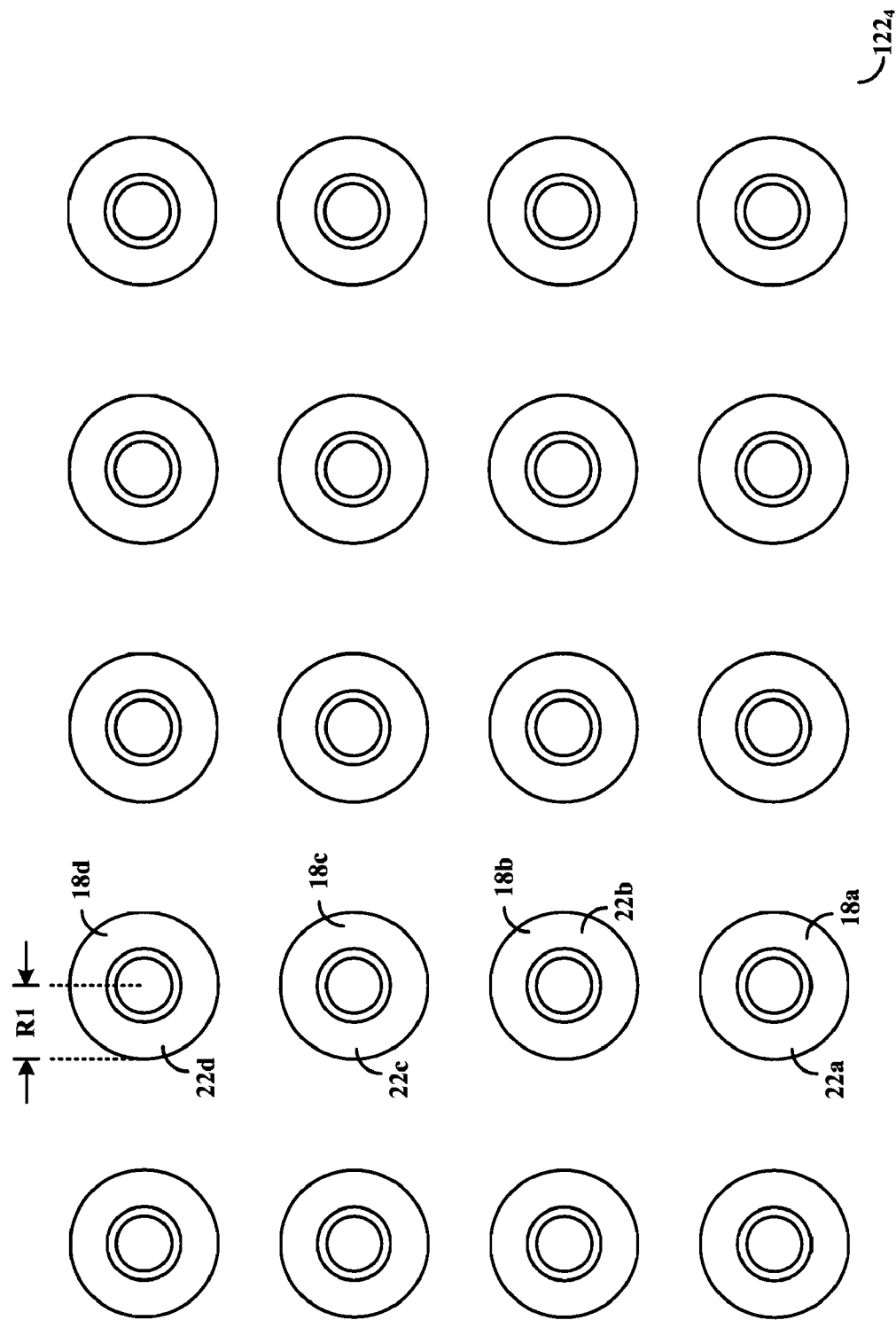
FIG. 4C is a plan view of an exemplary bottom layer of the multi-layer PCB designed in accordance with this invention.
Figure 4D:
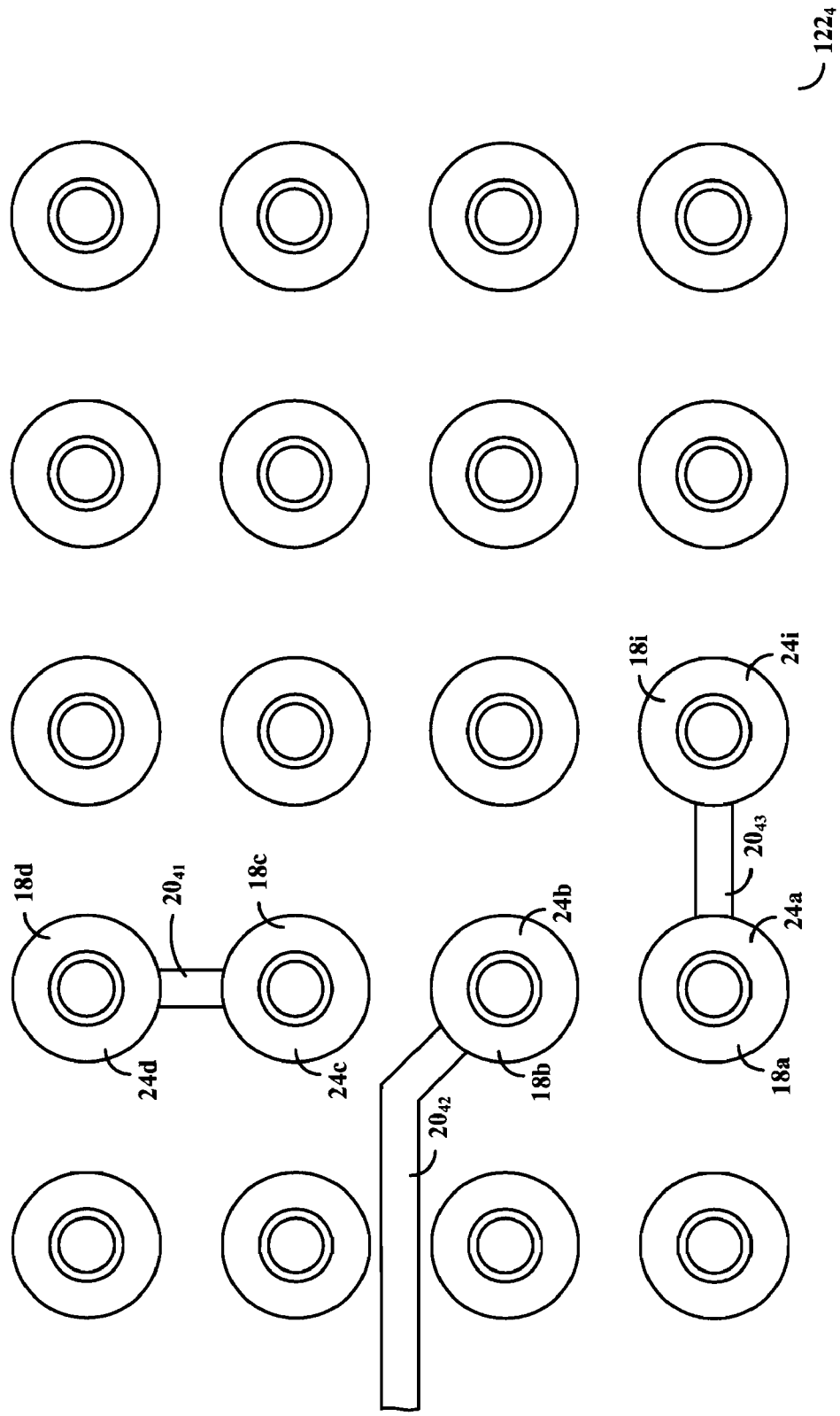
FIG. 4D is another plan view of the exemplary bottom layer of FIG. 4C.

In addition, methods in accordance with this invention may display an "initial" plan view of a bottom layer of the PCB layout 100 (i.e., a view of the bottom layer before any traces 20 have been laid out). FIG. 4C illustrates an exemplary initial plan view of bottom layer $122_3$. All vias 18 have a radius R1 on bottom layer $122_3$. A user may lay out traces 20 on the bottom layer $122_3$ in the same manner as with a conventional PCB CAD software program. FIG. 4D illustrates an exemplary layout of bottom layer $122_3$. Bottom layer $122_3$ includes trace $20_{41}$ coupled to bottom pads 24c and 24d of vias 18c and 18d, respectively, trace $20_{42}$ coupled to bottom pad 24b of via 18b, and trace $20_{43}$ coupled to bottom pads 24a and 24i of vias 18a and 18i, respectively. Persons of ordinary skill in the art will recognize that traces $20_{42}$ and $20_{43}$ on bottom layer $122_3$ replace traces $20_{34}$ and $20_{33}$, respectively, of intermediate layer $12_3$ shown in FIG. 3C.

Figure 5:
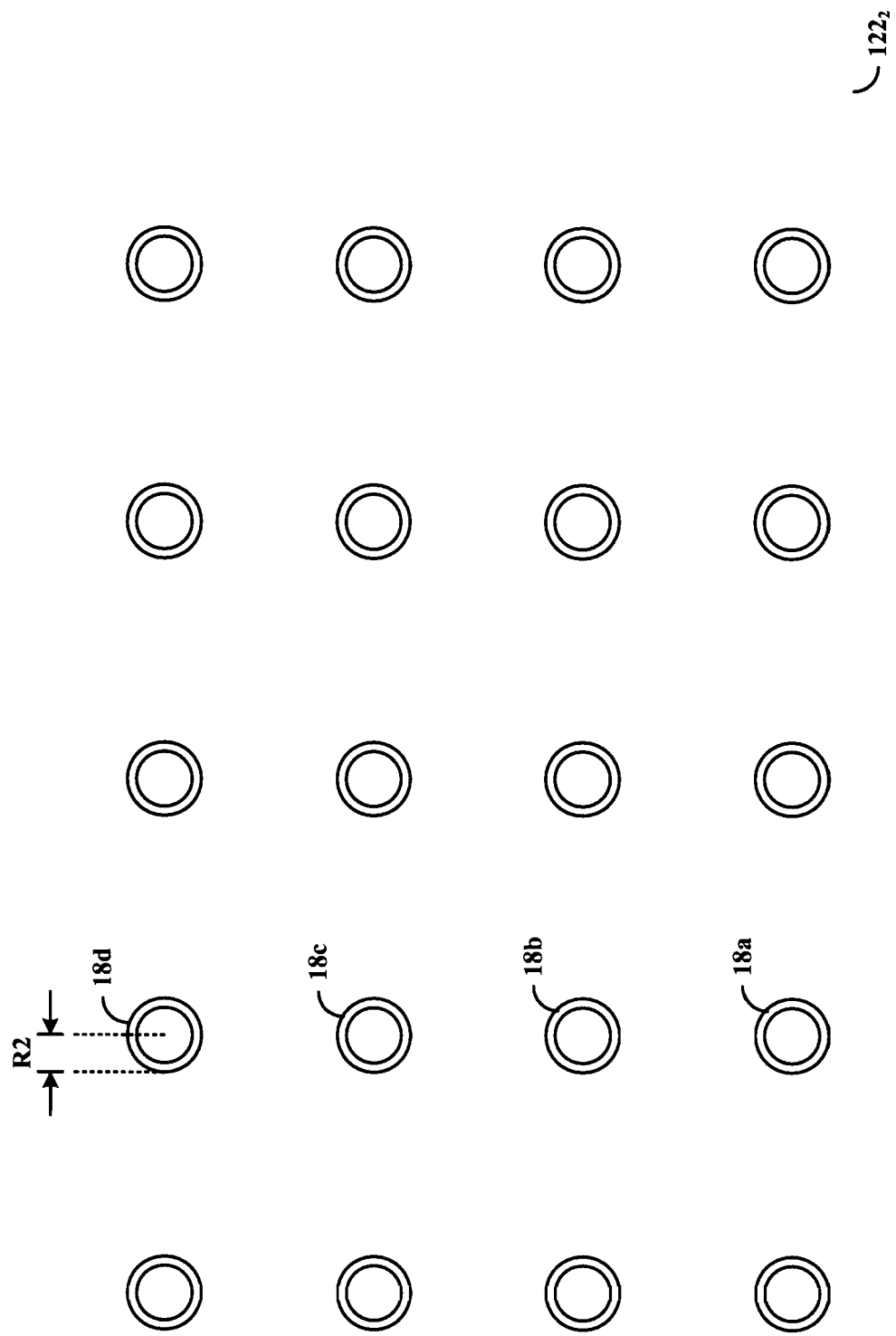
FIG. 5 is a plan view of an exemplary intermediate layer of a multi-layer PCB designed in accordance with this invention.

As described above, for top and bottom layers $122_1$ and $122_4$, respectively, all vias 18 have a static radius R1. In accordance with this invention, vias 18 on intermediate layers are dynamic vias that have features that adjust based on the trace layout. In particular, FIG. 5 illustrates an "initial" plan view of intermediate layer $122_2$, i.e., a view of intermediate layer $122_2$ before any traces 20 have been laid out on the layer. In this initial view, all vias 18 on intermediate layer $122_2$ have a radius R2, wherein R2 is less than R1. A user may begin laying out traces 20 on intermediate layer $122_2$. In accordance with this invention, during this layout process, each via 18 on intermediate layer $122_2$ has a feature that dynamically adjusts to the layout. That is, when no trace is coupled to a via 18 on intermediate layer $122_2$, the via 18 has a radius R2 on that layer. However, when a trace 20 is connected to the via 18 on intermediate layer $122_2$, the via radius changes from radius R2 to radius R1 on that layer.

For example, FIG. 6 illustrates a sequential layout of a plurality of traces 20 on intermediate layer $122_2$. In particular, FIG. 6A illustrates intermediate layer $122_2$ just as trace $20_{23}$ is added to the layout. Because no trace 20 connects to any via 18 in the illustrated region, all of the vias 18 have a radius R2. In FIG. 6B, when the end of trace $20_{23}$ is connected to via 18a (or when the end is brought within a predetermined distance from via 18a, such as within the minimum trace-to-via are gap distance), via 18a dynamically adjusts. In particular, intermediate pad 26a2 is added, and the radius of via 18a changes from R2 to R1 on intermediate layer $122_2$.

Figure 6C:
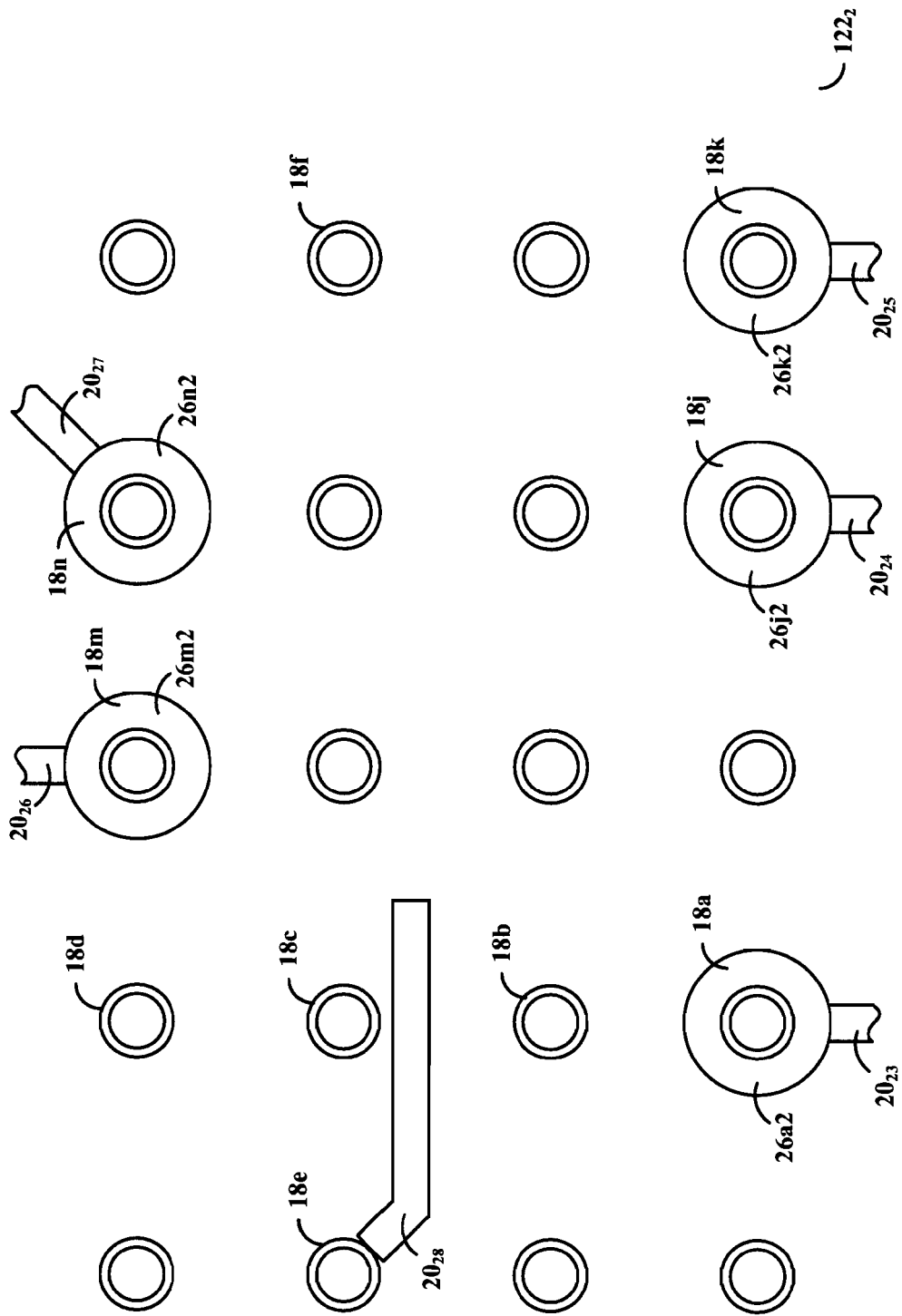
Figure 6D:
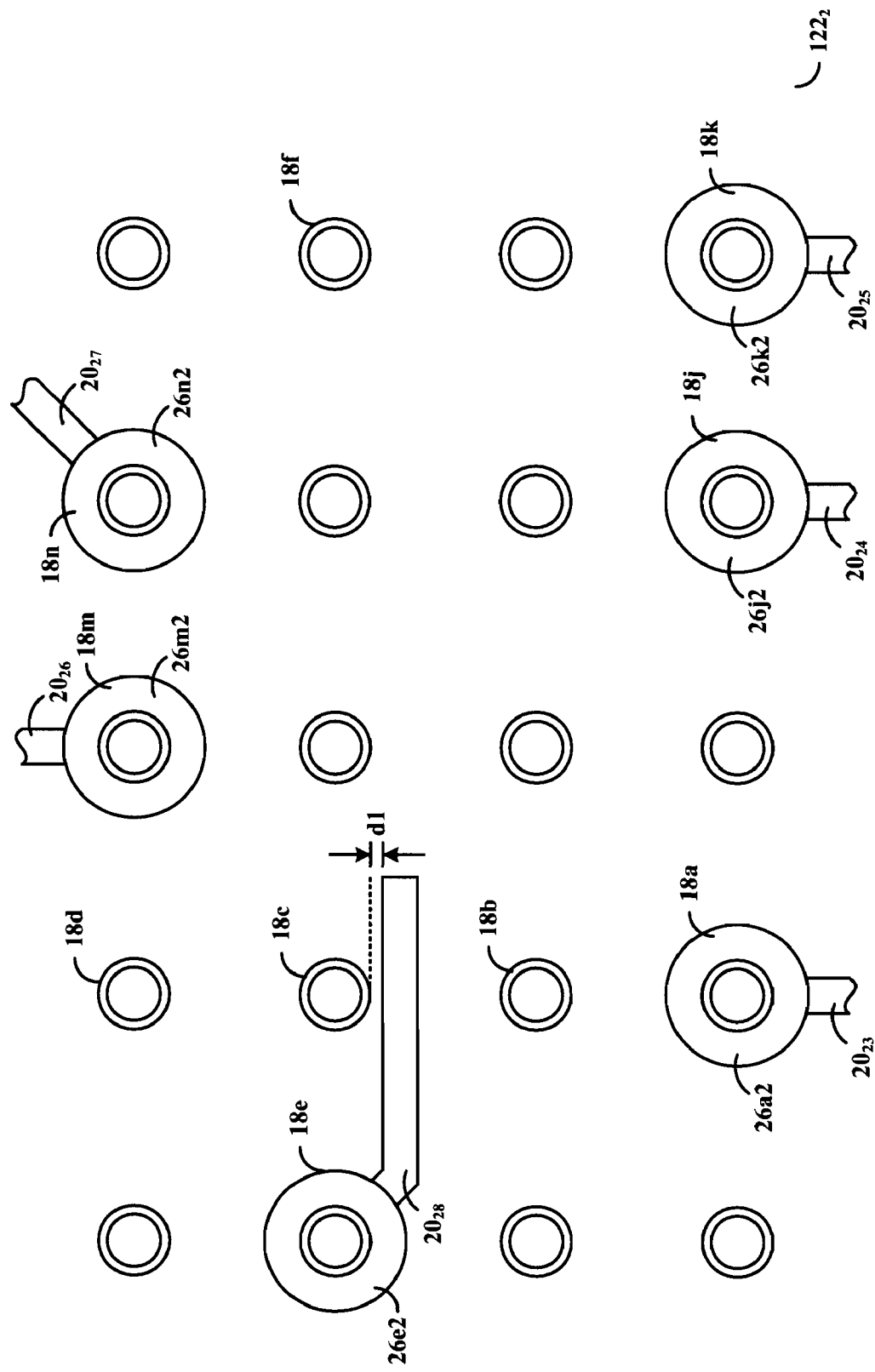
Figure 6E:
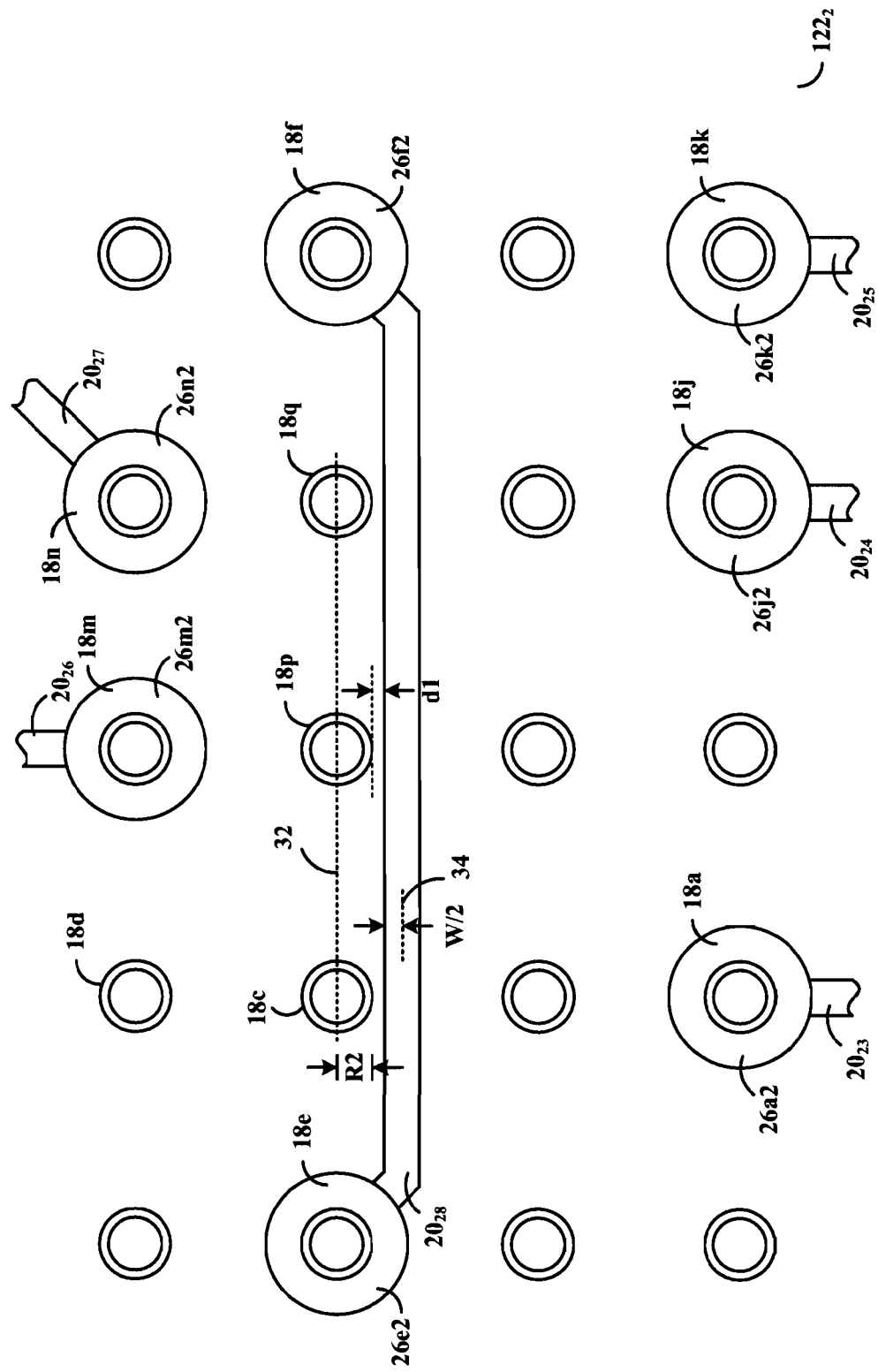

With each additional connection of a trace 20 to a via 18 on intermediate layer $122_2$, the via dynamically adjusts. Thus, as shown in FIGS. 6C and 6D, when an end of trace $20_{28}$ is connected to via 18e (or when it is brought within a predetermined distance from via 18e), via 18e dynamically adjusts. In particular, intermediate pad 26e2 is added to via 18e, and the radius of via 18e changes from R2 to R1 on intermediate layer $122_2$. Similarly, as shown in FIG. 6E, when the other end of trace $20_{28}$ is connected to via 18f (or when it is brought within a predetermined distance from via 18f), via 18f dynamically adjusts. In particular, intermediate pad 26f2 is added to via 18f, and the radius of via 18f changes from R2 to R1 on intermediate layer $122_2$.

Design rules specify that traces 20 may be laid out to within the minimum trace-to-pad air gap d1 of the peripheral edge of vias 18. In accordance with this invention, unconnected vias 18 on intermediate layers do not include pads 26, and thus traces 20 may be laid out much closer to unconnected vias 18 than would be allowed with conventional PCB layout techniques. For example, vias 18c, 18p and 18q are unconnected vias that each have a radius R2, and are all located along a common center axis 32. Trace $20_{28}$, which has a width W and a center axis 34, may be laid out to within the minimum trace-to-pad air gap d1 of the peripheral edge of vias 18c, 18p and 18q. That is, a minimum separation between center axis 32 and center axis 34 may be calculated as S2=(R2+d1+W/2), and trace $20_{28}$ may be laid out at the minimum separation S2 from vias 18c, 18p and 18q.

Figure 6F:
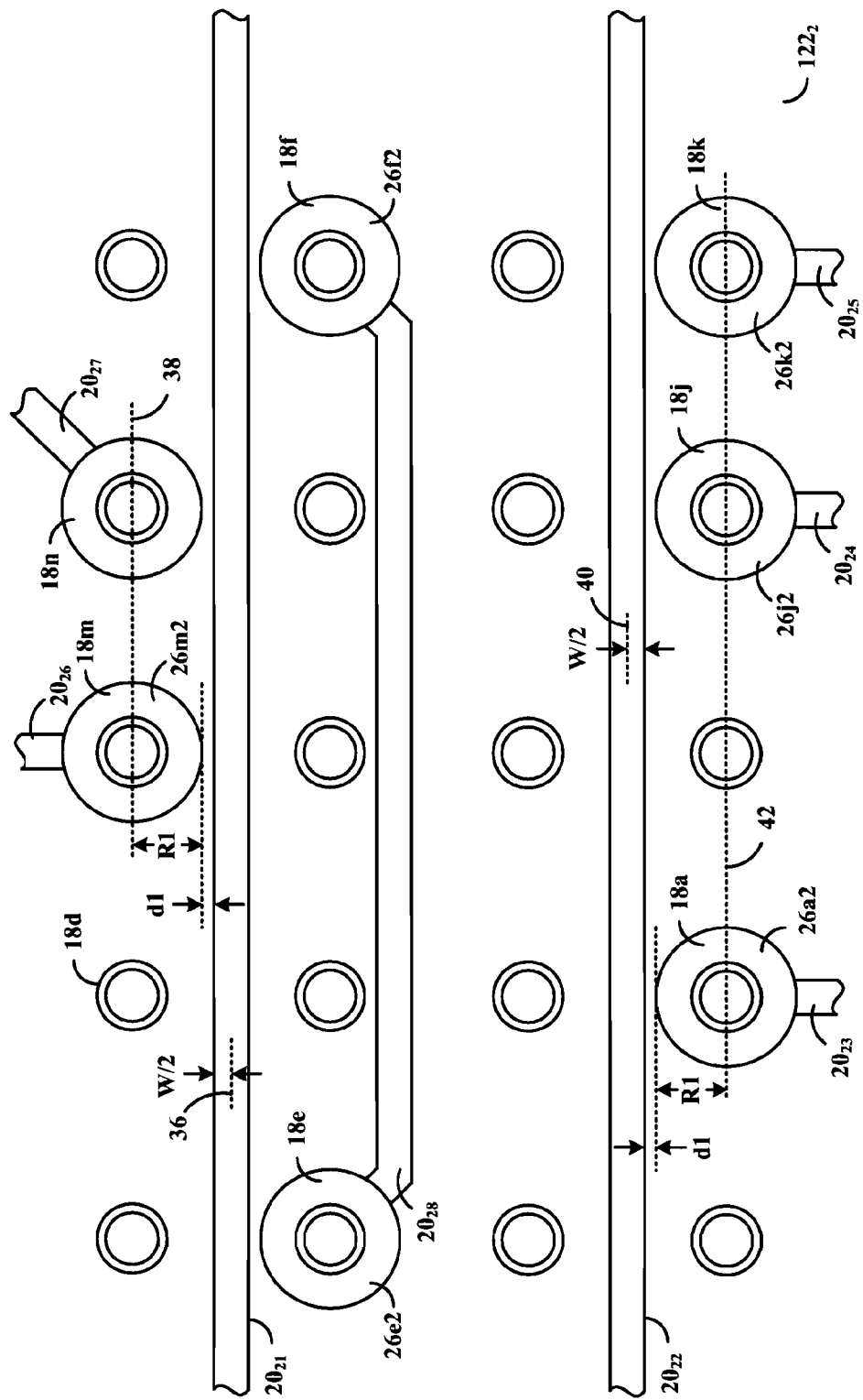

In contrast, connected vias 18a, 18e, 18f, 18j, 18k, 18m and 18n have corresponding pads 26a2, 26e2, 26f2, 26j2, 26k2, 26m2 and 26n2, respectively, and each have radius R1. As shown in FIG. 6F, trace $20_{21}$, which has a width W and a center axis 36, may be laid out to within the minimum trace-to-pad air gap d1 of the peripheral edge of vias 18e, 18f, 18m and 18n, which lie along a center axis 38. That is, a minimum separation between center axis 36 and center axis 38 may be calculated as S1=(R1+d1+W/2), and trace $20_{21}$ may be laid out at the minimum separation S1 from vias 18e, 18f, 18m and 18n. Similarly, trace $20_{22}$, which has a width W and a center axis 40 may be laid out to within the minimum trace-to-pad air gap d1 of the peripheral edge of vias 18a, 18j and 18k, which lie along a center axis 42. That is, trace $20_{22}$ may be laid out at the minimum separation S1 from vias 18a, 18j and 18k.

Figure 6G:
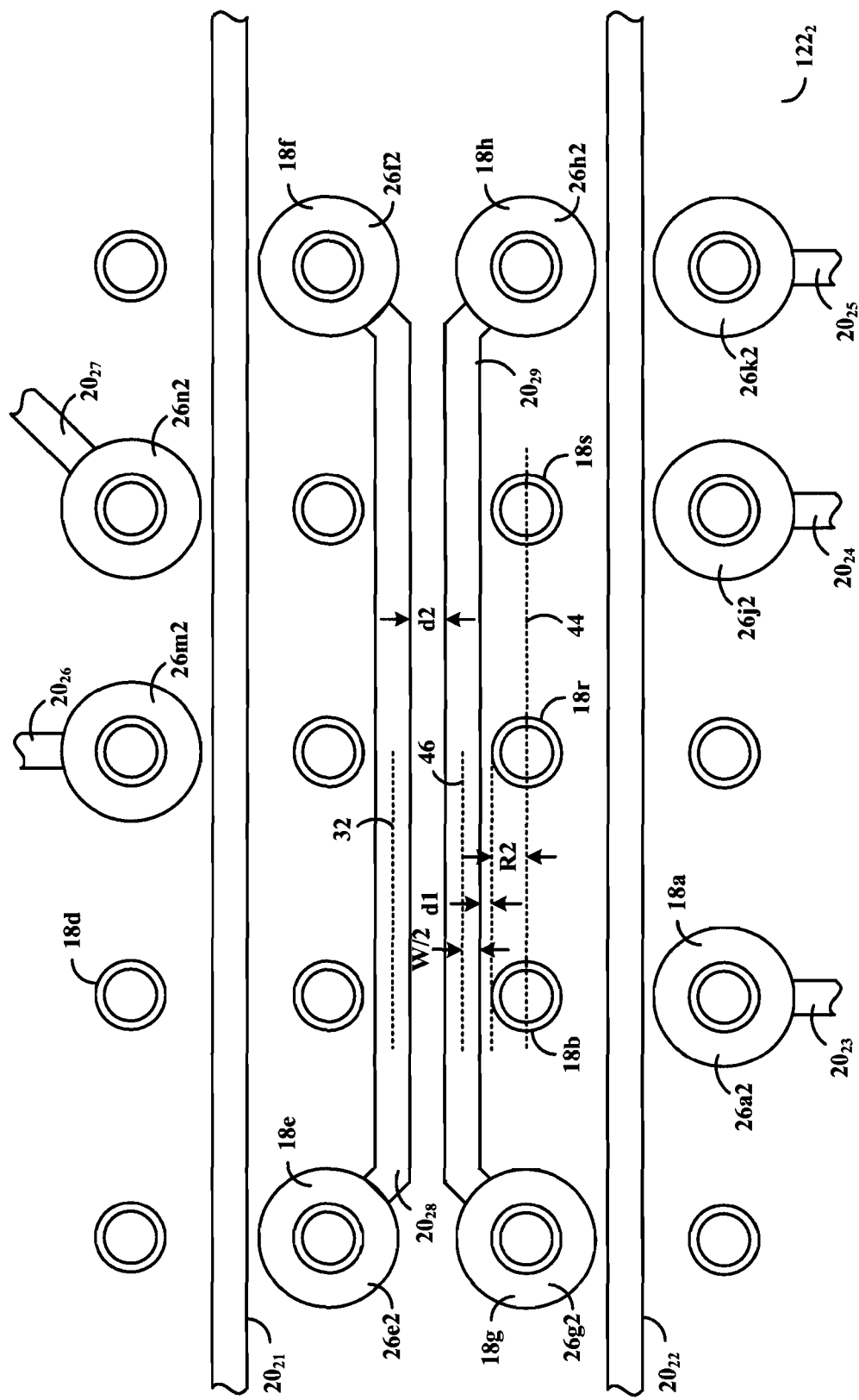

This process continues with the addition of each subsequent trace 20. As shown in FIG. 6G, when trace $20_{29}$ is connected to vias 18g and 18h, intermediate pads 26g2 and 26h2 are added, and the radius of vias 18g and 18h changes from R2 to R1 on intermediate layer $122_2$. Additionally, trace $20_{29}$ may be routed to within the minimum trace-to-pad air gap d1 of vias 18b, 18r and 18s, and to within the minimum trace-to-trace air gap d2 of trace $20_{28}$. That is, if vias 18b, 18r and 18s are located along a common center axis 44, and trace $20_{29}$ has a width W and a center axis 46, then trace $20_{29}$ may be laid out at a minimum distance between center axis 44 and center axis 46 of (W/2+d1+R2), and at a minimum distance between center axis 32 and center axis 46 of (W+d2).

Figure 7:
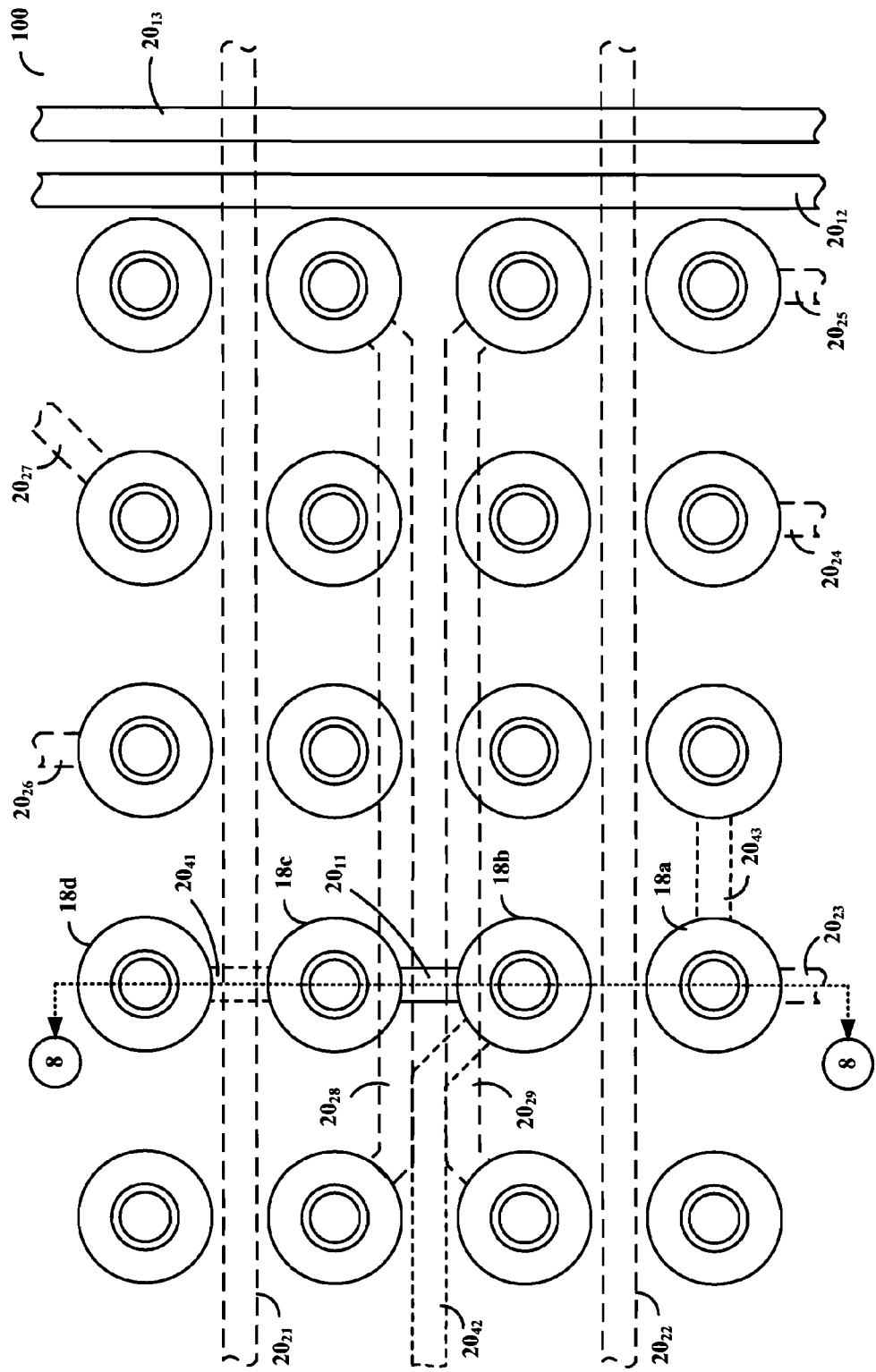
FIG. 7 is a plan view of the exemplary multi-layer PCB of FIGS. 4-6, designed in accordance with this invention.
Figure 8:
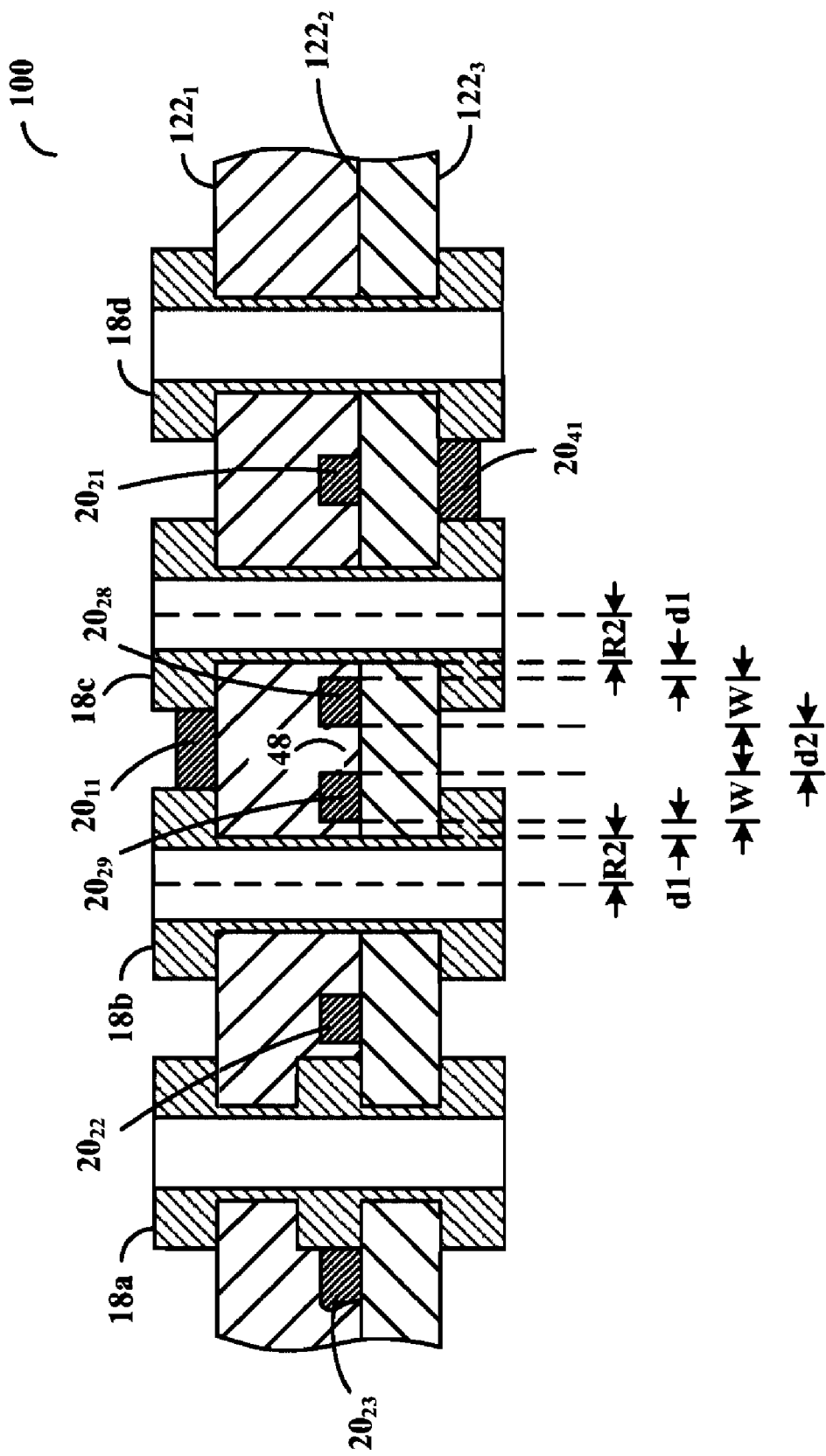
FIG. 8 is a cross-sectional side view of the multi-layer PCB of FIG. 7.

Thus, as shown in FIGS. 7 and 8, by providing dynamically adjustable vias, traces $20_{28}$ and $20_{29}$ may be laid out on intermediate layer $122_2$ in region 48 between vias 18b and 18c. In this regard, comparing FIGS. 7 and 8 with FIGS. 1 and 2, PCB 100 includes the identical electrical connectivity as PCB 10, but requires one less intermediate layer. Thus, methods in accordance with this invention may be used to increase the available layout area for routing electrically conductive traces, and reduce the number of layers required in multilayer circuit substrates, such as multi-layer PCBs.

The number n of minimum-width W traces that may be laid out between two adjacent vias separated by a pitch P may be calculated as:

| Pad Configuration | Number of Traces |
|---|---|
| If the first and second vias each have a connected pad on the layer | $n = \dfrac{(P - 2 \times R1 - 2 \times d1 + d2)}{(W + d2)}$ |
| If the first and second vias each have no connected pad on the layer | $n = \dfrac{(P - 2 \times R2 - 2 \times d1 + d2)}{(W + d2)}$ |
| If one of the first or second vias has a connected pad on the layer, and the other of the first or second vias does not have a connected pad on the layer | $n = \dfrac{(P - R1 - R2 - 2 \times d1 + d2)}{(W + d2)}$ |

Apparatus and methods in accordance with this invention may be implemented as a computer-implemented method, system, and computer program product. In particular, this invention may be implemented within a network environment (e.g., the Internet, a wide area network ("WAN"), a local area network ("LAN"), a virtual private network ("VPN"), etc.), or on a stand-alone computer system. In the case of the former, communication throughout the network can occur via any combination of various types of communications links. For example, the communication links may comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet.

Figure 9:
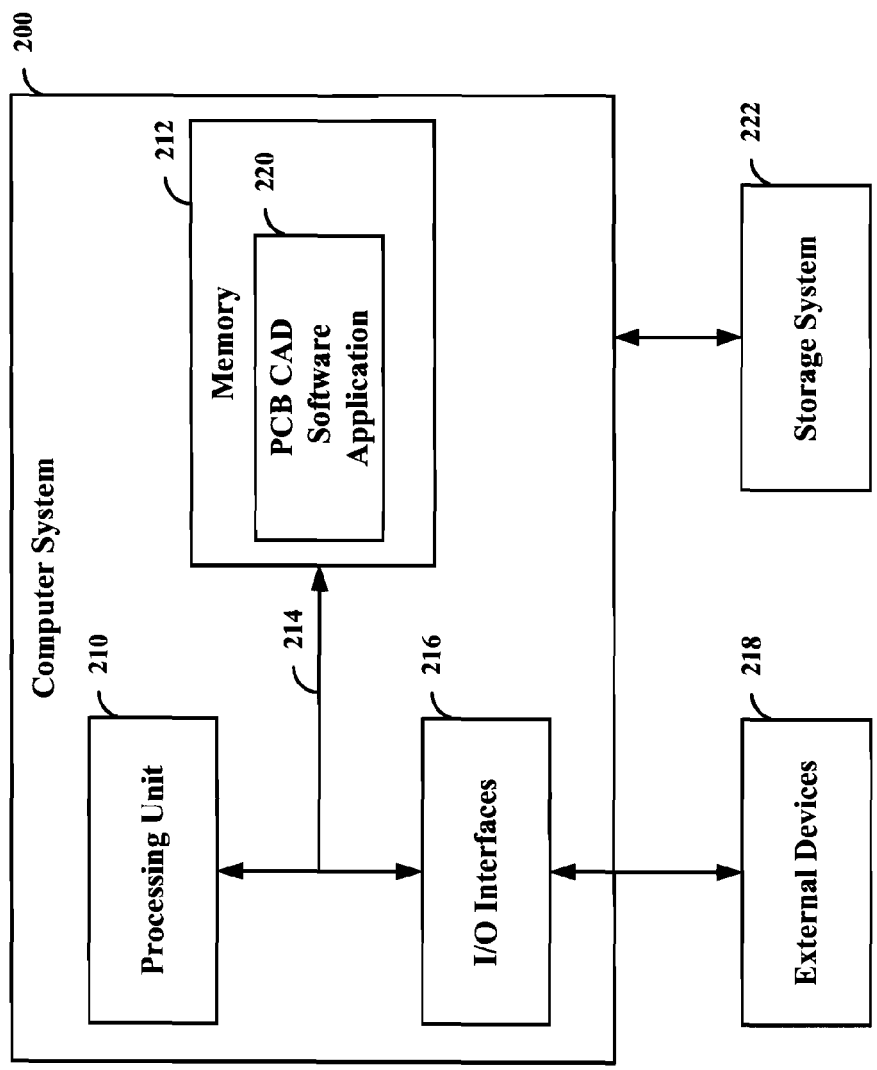
FIG. 9 is an exemplary system for performing multi-layer circuit substrate design and layout processes in accordance with this invention.

For example, as shown in FIG. 9, the present invention may be implemented on a computer system, such as computer system 200 that includes a processing unit 210, a memory 212, a bus 214, input/output ("I/O") interfaces 216 and external devices 218. Processing unit 210 may be a computer or processing unit of any type that is capable of performing the functions described herein. Memory 212 is capable of storing a set of machine readable instructions (i.e., computer software) executable by processing unit 210 to perform the desired functions. Memory 212 is any type of physical computer readable carrier or media for storing information in a digital format on a permanent or temporary basis, such as, e.g., a magnetic media, optical media, flash memory, random access memory, or other similar memory.

In particular, memory 212 includes a PCB CAD software application 220, which is a software program that provides the functions of the present invention. Alternatively, application 220 may be stored on storage system 222. Processing unit 210 executes application 220. While executing computer program code 220, processing unit 210 can read and/or write data to/from memory 212, storage system 222 and/or I/O interfaces 216. Bus 214 provides a communication link between each of the components in computer system 200. External devices 218 can comprise any devices (e.g., keyboard, pointing device, display, etc.) that enable a user to interact with computer system 200 and/or any devices (e.g., network card, modem, etc.) that enable computer system 200 to communicate with one or more other computing devices.

Computer system 200 may include two or more computing devices (e.g., a server cluster) that communicate over a network to perform the various process steps of the invention. Embodiments of computer system 200 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Moreover, processing unit 210 can comprise a single processing unit, or can be distributed across one or more processing units in one or more locations, e.g., on a client and server. Similarly, memory 212 and/or storage system 222 can comprise any combination of various types of data storage and/or transmission media that reside at one or more physical locations. Further, I/O interfaces 216 can comprise any system for exchanging information with one or more external devices 218. In addition, one or more additional components (e.g., system software, math co-processing unit, etc.) not shown in FIG. 9 can be included in computer system 200.

Storage system 222 may include one or more storage devices, such as a magnetic disk drive or an optical disk drive. Alternatively, storage system 222 may include data distributed across, for example, a LAN, WAN or a storage area network ("SAN") (not shown). Although not shown in FIG. 9, additional components, such as cache memory, communication systems, system software, etc., may be incorporated into computer system 200.

The foregoing merely illustrates the principles of this invention, and various modifications can be made by persons of ordinary skill in the art without departing from the scope and spirit of this invention. For example, persons of ordinary skill in the art will understand that techniques in accordance with this invention may be applied to a wide variety of multi-layer circuit substrates, such as multi-layer integrated circuits, multi-layer integrated circuit die packaging devices, and other similar devices.

The invention claimed is:

1. A method for laying out a layer of a multi-layer circuit substrate, the method comprising:
   providing a via that has a center axis and a second radius R2;
   adding a pad and changing the via radius from the second radius to a first radius R1 for a first trace connected to the via on an intermediate layer, where R1 is greater than R2;
   providing a second trace that has a width W and a center axis; and
   calculating a first minimum separation S1=(R1+d1+W/2), and a second minimum separation S2=(R2+d1+W/2), wherein d1 is a minimum trace-to-pad air gap d1.

2. The method of claim 1, wherein the multi-layer circuit comprises an integrated circuit.

3. The method of claim 1, wherein the circuit comprises a printed circuit board.

4. The method of claim 1, further comprising:
   if the via has a pad on the layer, laying out the second trace center axis no closer than a first minimum separation S1 from the via center axis; and
   if the via has no pad on the layer, laying out the second trace center axis no closer than a second minimum separation S2 from the via center axis.

5. The method of claim 1, wherein if the via has a connected pad on the layer, laying out the second trace center axis substantially at the first minimum separation S1 from the via center axis.

6. The method of claim 1, wherein if the via has an unconnected pad on the layer, laying out the second trace center axis substantially at the second minimum separation S2 from the via center axis.

7. A method for laying out a plurality of traces on a layer of a multi-layer circuit comprising first and second vias separated by a pitch P, each via having a first radius R1 and a second radius R2, each trace having a minimum width W, and wherein a design rule for the circuit specifies a minimum trace-to-pad air gap d1 and a minimum trace-to-trace air gap d2, the method comprising:
   calculating a first available space between the first and second vias using the first radius R1;
   calculating a second available space between the first and second vias using the second radius R2;
   calculating a third available space between the first and second vias using the first radius R1 and the second radius R2;
   if the first and second vias each have a connected pad on the layer, calculating a first number of minimum-width traces that can be laid out using the first available space, and communicating to a user the first number of minimum-width traces;
   if the first and second vias each have no connected pad on the layer, calculating a second number of minimum-width traces that can be laid out using the second available space, and communicating to the user the second number of minimum-width traces; and
   if one of the first or second vias has a connected pad on the layer, and the other of the first or second vias does not have a connected pad on the layer, calculating a third number of minimum-width traces that can be laid out using the third available space, and communicating to the user the third number of minimum-width traces.

8. The method of claim 7, wherein the first number of minimum-width traces that can be laid out using the first available space is less than or equal to:

$$\frac{(P - 2 \times R1 - 2 \times d1 + d2)}{(W + d2)}.$$

9. The method of claim 7, wherein the second number of minimum-width traces that can be laid out using the second available space is less than or equal to:

$$\frac{(P - 2 \times R2 - 2 \times d1 + d2)}{(W + d2)}.$$

10. The method of claim 7, wherein the third number of minimum-width traces that can be laid out using the third available space is less than or equal to:

$$\frac{(P - R1 - R2 - 2 \times d1 + d2)}{(W + d2)}.$$

11. A physical, non-transitory computer-readable carrier including computer program instructions for laying out a layer of a multi-layer circuit substrate, the computer program instructions configured to cause a computer to:
provide a via that has a center axis and a second radius R2;
add a pad and change the via radius from the second radius to a first radius R1 for a first trace connected to the via on an intermediate layer, where R1 is greater than R2;
provide a second trace that has a width W and a center axis; and
calculate a first minimum separation S1=(R1+d1+W/2), and a second minimum separation S2=(R2+d1+W/2), wherein d1 is a minimum trace-to-pad air gap d1.

12. The physical computer-readable carrier of claim 11, wherein the multi-layer circuit comprises an integrated circuit.

13. The physical computer-readable carrier of claim 11, wherein the circuit comprises a printed circuit board.

14. The physical computer-readable carrier of claim 11, wherein the computer program instructions are further configured to cause the computer to:
lay out the second trace center axis no closer than a first minimum separation S1 from the via center axis if the via has a pad on the layer; and
lay out the second trace center axis no closer than a second minimum separation S2 from the via center axis if the via has no pad on the layer.

15. The physical computer-readable carrier of claim 11, wherein the computer program instructions are further configured to cause the computer to lay out the second trace center axis substantially at the first minimum separation S1 from the via center axis if the via has a connected pad on the layer.

16. The physical computer-readable carrier of claim 11, wherein the computer program instructions are further configured to cause the computer to lay out the second trace center axis substantially at the second minimum separation S2 from the via center axis if the via has an unconnected pad on the layer.

17. A physical, non-transitory computer-readable carrier including computer program instructions for laying out a plurality of traces on a layer of a multi-layer circuit comprising first and second vias separated by a pitch P, each via having a first radius R1 and a second radius R2, each trace having a minimum width W, and wherein a design rule for the circuit specifies a minimum trace-to-pad air gap d1 and a minimum trace-to-trace air gap d2, the computer program instructions configured to cause a computer to:
calculate a first available space between the first and second vias using the first radius R1;
calculate a second available space between the first and second vias using the second radius R2;
calculate a third available space between the first and second vias using the first radius R1 and the second radius R2;
if the first and second vias each have a connected pad on the layer, calculate a first number of minimum-width traces that can be laid out using the first available space, and communicating to a user the first number of minimum-width traces;
if the first and second vias each have no connected pad on the layer, calculate a second number of minimum-width traces that can be laid out using the second available space, and communicating to the user the second, number of minimum-width traces; and
if one of the first or second vias has a connected pad on the layer, and the other of the first or second vias does not have a connected pad on the layer, calculate a third number of minimum-width traces that can be laid out using the third available space, and communicating to the user the third number of minimum-width traces.

18. The physical computer-readable carrier of claim 17, wherein the computer program instructions are further configured to cause the computer to calculate the first number of minimum-width traces that can be laid out using the first available space as less than or equal to:

$$\frac{(P - 2 \times R1 - 2 \times d1 + d2)}{(W + d2)}.$$

19. The physical computer-readable carrier of claim 17, wherein the computer program instructions are further configured to cause the computer to calculate the second number of minimum-width traces that can be laid out using the second available space as less than or equal to:

$$\frac{(P - 2 \times R2 - 2 \times d1 + d2)}{(W + d2)}.$$

20. The physical computer-readable carrier of claim 17, wherein the computer program instructions are further configured to cause the computer to calculate the third number of minimum-width traces that can be laid out using the third available space as less than or equal to:

$$\frac{(P - R1 - R2 - 2 \times d1 + d2)}{(W + d2)}.$$

* * * * *